(12) United States Patent
Hou et al.

(10) Patent No.: US 10,270,149 B2
(45) Date of Patent: Apr. 23, 2019

(54) CIRCULATOR DEVICE WITH TWO MAGNET-FREE CIRCULATORS

(71) Applicant: Telefonaktiebolaget LM Ericsson (publ), Stockholm (SE)

(72) Inventors: Rui Hou, Schipluiden (NL); Lars Ridell Virtanen, Gävle (SE)

(73) Assignee: TELEFONAKTIEBOLAGET LM ERICSSON (PUBL), Stockholm (SE)

(*) Notice: Subject to any disclaimer, the term of this patent is extended or adjusted under 35 U.S.C. 154(b) by 377 days.

(21) Appl. No.: 15/037,799

(22) PCT Filed: Apr. 22, 2016

(86) PCT No.: PCT/SE2016/050353
§ 371 (c)(1),
(2) Date: May 19, 2016

(87) PCT Pub. No.: WO2017/184046
PCT Pub. Date: Oct. 26, 2017

(65) Prior Publication Data
US 2018/0123204 A1    May 3, 2018

(51) Int. Cl.
*H01P 1/38*  (2006.01)
*H01P 1/36*  (2006.01)
*H03H 7/52*  (2006.01)
*H04B 1/00*  (2006.01)
*H04B 1/40*  (2015.01)

(52) U.S. Cl.
CPC ............... *H01P 1/38* (2013.01); *H01P 1/36* (2013.01); *H03H 7/52* (2013.01); *H04B 1/00* (2013.01); *H04B 1/40* (2013.01)

(58) Field of Classification Search
CPC .................................. H01P 1/38; H01P 1/36
USPC ........................................................ 327/551
See application file for complete search history.

(56) References Cited

U.S. PATENT DOCUMENTS

| 4,122,399 A | 10/1978 | Heiter et al. |
| 7,719,384 B1 | 5/2010 | Arceo et al. |
| 2009/0296790 A1 | 12/2009 | Cheung et al. |
| 2010/0216413 A1 | 8/2010 | Khannur |
| 2011/0068877 A1* | 3/2011 | Chawla ............... H01P 1/387 333/1.1 |
| 2016/0087823 A1* | 3/2016 | Wang ............... H04L 25/0272 375/257 |

OTHER PUBLICATIONS

Fleury et al. "Magnetless circulators for electromagnetic and acousti waves"; 2016 10th European Conference on Antennas and Propagation (EUCAP), European Assocation of Antennas and Propagation; XP032906954; Apr. 10, 2016; pp. 1-3.

(Continued)

*Primary Examiner* — Thomas Skibinski
(74) *Attorney, Agent, or Firm* — Coats & Bennett, PLLC

(57) ABSTRACT

There is provided a circulator device. The circulator device comprises two magnet-free circulators. Each magnet-free circulator has a forced time variance. The circulator device comprises ports. The two circulators are in the circulator device arranged to have mutually anti-phase time variance. Each of the two circulators is coupled to all of the ports. There is also presented an isolator device comprising such a circulator device. There is also presented a radio transceiver device comprising such a circulator device or isolator device.

24 Claims, 10 Drawing Sheets

(56) References Cited

OTHER PUBLICATIONS

Qin et al. "Nonreciprocal Components with Distributedly Modulated Capacitors"; IEEE Transactions on Microwave Theory and Techniques; XP011560365; Oct. 1, 2014; pp. 2260-2272; IEEE Service Center, Piscataway, NJ.
Cheung et al. "Active Quasi-Circulators using Quadrature Hybrids for Simultaneous Transmit and Receive"; Microwave Symposium Digest; 2009; pp. 381-384; IEEE MTT-S International, IEEE, Piscataway, NJ.
Estep, N. A., et al., "Magnetless Microwave Circulators Based on Spatiotemporally Modulated Rings of Coupled Resonators", IEEE Transactions on Microwave Theory and Techniques, Feb. 1, 2016, pp. 502-518, vol. 64, No. 2, IEEE.
Reiskarimian, N., et al., "Magnetic-free non-reciprocity based on staggered commutation", Article, Nature Communication, Apr. 15, 2016, pp. 1-10, DOI: 10.1038/ncomms11217.
Chen, P., et al., "A High Isolation Quasi-Circulator with Self-Adjusting Technique," Proceedings of Asia-Pacific Microwave Conference 2014, IEICE, Nov. 4, 2014, XP032750285, pp. 268-270.

\* cited by examiner

CIRCULATOR DEVICE WITH TWO MAGNET-FREE CIRCULATORS

TECHNICAL FIELD

Embodiments presented herein relate to a circulator device comprising two magnet-free circulators.

BACKGROUND

In general terms, a circulator is a microwave device having the property of non-reciprocity. This means that the transmission of a circulator in one (forward) direction is much higher than that in the other (reverse) direction. In more specialized terms, the forward transmission loss is called insertion loss, whereas the reverse transmission loss is called isolation. Hence, a circulator has an intrinsic property that its insertion loss is much smaller than its isolation.

Most circulators have three ports (denoted port 1, port 2, and port 3 for brevity). In such a circulator, if the forward transmission traverses cyclically via port 1, port 2, and port 3 in sequence, the reverse transmission would traverse cyclically via port 3, port 2, and port 1 in sequence, and vice versa.

Circulators are widely used in radio frequency (RF) and microwave transceivers, such as in radio base stations. For example, an isolator (as represented by a circulator having only two ports) can be arranged between a transmitter and an antenna to protect the transmitter from antenna mismatch. In such a configuration, the forward power from the transmitter is passed to the antenna with low loss whereas the reflected power (due to possible antenna impedance mismatch) is heavily attenuated, so as not to affect the transmitter. Another typical example is to substitute the isolator by a three-port circulator for antenna transmission and reception duplexing. In this case, the transmitter signals are only passed to the antenna whereas any received signal from the antenna is only passed to the receiver. The reverse transmissions are greatly suppressed by the circulator.

Despite the large number of useful scenarios, the non-reciprocity essential to the circulator operation can currently only be found in two types of materials, namely ferrimagnets and plasma. The great majority of practical circulators are made from ferrimagnetic materials. However, alternatively, circulators can be made from active electronic devices, such as unilateral amplifiers made from biased transistors. In practice, due to the inferior noise, linearity, power consumption and power handling capabilities of transistors, biased transistors are rarely used to make circulators.

It has in "Magnetless Microwave Circulators Based on Spatiotemporally Modulated Rings of Coupled Resonators", N. A. Estep, D. L. Sounas, and A. Alù, in IEEE Transactions on Microwave Theory and Techniques, vol. 64, no. 2, pp. 502-518, February 2016, been proposed to synthesize magnet-free circulators from variable capacitance diodes (also known as varactors). Variable capacitance diodes are a type of active electronic device. In such a design, a circular resonator is made from varactors resonating with inductors or transmission lines. The varactors are modulated by poly-phase sinusoidal signals with circular phase progression. As such, a forced time-varying device is made to permit wave propagation in both clockwise and counter-clockwise directions, but with different propagation velocity. As used hereinafter, the term forced time variance is defined as a behavior of a device such that its input-output relationship is forced to vary in time. The circulator made as such can be very compact and low-cost, and furthermore easily implementable on monolithic integrated circuits (IC), such as complementary-metal-oxide-semiconductor (CMOS) on silicon.

It has in "Magnetic-free non-reciprocity based on staggered commutation", Negar Reiskarimian and Harish Krishnaswamy, in Nature Communications, published online Apr. 15, 2016, been proposed another magnet-free circulator synthesized from CMOS transistor switches. In such a design, the transistor switches are periodically switched, but in a sequence of staggering commutation, in order to achieve non-reciprocity. A transistor switch does not need a direct current (DC) bias, therefore it is often referred to as a "passive switch". But a transistor switch is considered to be an active electronic device. Furthermore, the periodically driven switches have also forced time variance.

Conventional circulators, made from ferrimagnetic materials, are not compatible with semiconductor IC integration. Furthermore, it requires precision mechanical machining and assembly. As a result, ferrimagnetic circulators are bulky and expensive, thus unfavorable to high-volume, highly integrated applications such as antenna arrays.

Circulators made from DC biased transistors can be IC compatible. But DC biased transistors not only consume power but also generate both noise and non-linear harmonic and intermodulation produces. Furthermore, in high power applications, transistors limit power handling capability and efficiency.

The magnet-free circulators described above require a non-zero frequency modulation. It is therefore a forced time-varying device. One inevitable property of forced time-varying devices is the generation of intermodulation products, even if they are perfectly linear. More specifically, the magnet-free circulators described above unavoidably mix RF signals with its local modulation signals, effectively diverging RF power into other frequencies. This power diverging behavior limits the achievable insertion loss for this type of circulators.

Hence, there is still a need for an improved circulator device.

SUMMARY

An object of embodiments herein is to provide an improved circulator device.

According to a first aspect there is presented a circulator device. The circulator device comprises two magnet-free circulators. Each magnet-free circulator has a forced time variance. The circulator device comprises ports. The two circulators are in the circulator device arranged to have mutually anti-phase time variance. Each of the two circulators is coupled to all of the ports.

Advantageously this provides an improved circulator device compared to the circulators described in the Background section.

The inferior insertion loss of the above described magnet-free circulators can be improved drastically by the herein proposed circulator device.

Compared with the above described magnet-free circulators, a drastically lower insertion loss can be achieved by the herein proposed circulator device, because the dominant loss mechanism in this type of forced time-varying circulators, namely the diversion of power from RF to intermodulation frequencies, is cancelled out.

Compared with conventional circulators, i.e. circulators made from ferrimagnetic materials, the herein proposed circulator device can be made on common semiconductor materials (e.g. silicon). As such, the compatibility with IC technologies (e.g. CMOS) permits compact and low-cost implementations.

Furthermore, compared with ferrimagnetic circulators, the operating frequency of the herein proposed circulator device can be electrically tuned within a broad frequency range. This tunability enables reconfigurable radio hardware with favorable implications such as reduced non-recursive engineering cost and economies of scale.

According to a second aspect there is presented an isolator device. The isolator device comprises a circulator device according to the first aspect. The two circulators form a circulator module. One of the ports of the circulator device is terminated via a matched termination impedance.

According to a third aspect there is presented a radio transceiver device. The radio transceiver device comprises at least one circulator device according to the first aspect or an isolator device according to the second aspect.

It is to be noted that any feature of the first, second and third aspects may be applied to any other aspect, wherever appropriate. Likewise, any advantage of the first aspect may equally apply to the second, and/or third aspect, respectively, and vice versa. Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any step or feature illustrated by dashed lines should be regarded as optional.

Figure 1A:
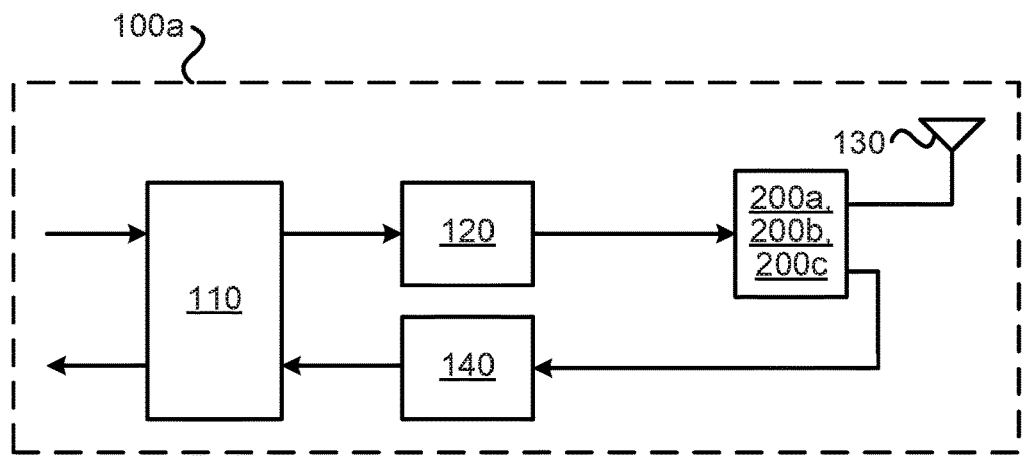
FIGS. 1a and 1b are schematic diagrams illustrating a radio transceiver device according to embodiments.
Figure 1B:
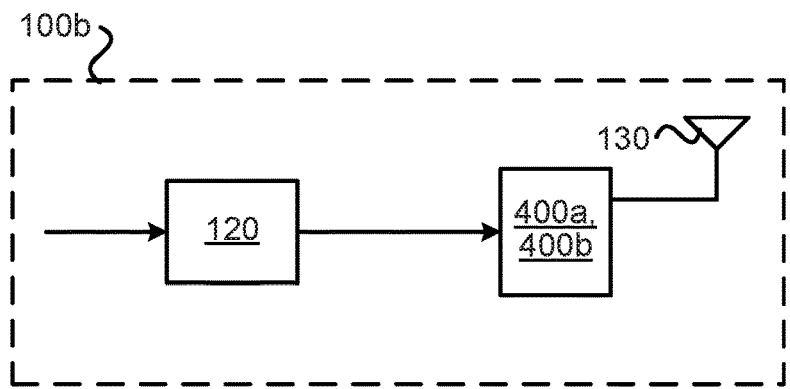

FIGS. 1a and 1b are schematic diagrams illustrating a radio transceiver device 100a, 100b according to embodiments. The radio transceiver device 100a, 100b can be a radio access network node such as a radio base station, a base transceiver station, a node B, or an evolved node B. Further, the radio transceiver device 100a, 100b can be a portable wireless device such as a mobile station, a mobile phone, a handset, a wireless local loop phone, a user equipment (UE), a smartphone, a laptop computer, a tablet computer, sensor device, or a wireless modem device.

With particular reference to FIG. 1a the radio transceiver device 100a comprises baseband circuitry 110, transmitter circuitry 120 (comprising RF or microwave circuitry), receiver circuitry 140 (comprising RF or microwave circuitry), a circulator device 200a, 200b, 200c, 200d and an antenna 130. The circulator device 200a, 200b, 200c, 200d comprises three ports. As described above, a three-port circulator device 200a, 200b, 200c can be used for antenna transmission and reception duplexing where signals provided by the transmitter circuitry 120 are only passed to the antenna 130 whereas any received signal from the antenna 130 is only passed to the receiver circuitry 140.

With particular reference to FIG. 1b the radio transceiver device 100b comprises transmitter circuitry 120 (comprising RF or microwave circuitry), an isolator device 400a, 400b (in turn comprising a circulator device) and an antenna 130. The isolator device 400a, 400b comprises two ports. As described above, the isolator device 400a, 400b allows the forward power from the transmitter circuitry 120 to be passed to the antenna with low loss whereas causing the reflected power (due to possible antenna impedance mismatch) to be heavily attenuated, so as not to affect the transmitter.

The magnet-free circulators described in the Background section are forced time-varying devices requiring local modulations. Even if such a circulator is perfectly linear, its time variance inevitably mixes incoming RF signals with the local modulation signals, so a portion of the RF power is diverted to intermodulation frequencies. This RF power diversion is one cause of the insertion loss in this type of forced time-varying circulators. One object of the herein disclosed circulator devices 200a, 200b, 200c, 200d, 200e is to mitigate, or at least reduce, these issues.

Aspects of the circulator device 200a, 200b, 200c, 200d, 200e and the isolator device 400a, 400b will now be disclosed in turn.

FIGS. 2a, 2b, 2c, 2d, and 2e are schematic diagram of circulator devices 200a, 200b, 200c, 200d, 200e according to embodiments.

The circulator device 200a, 200b, 200c, 200d, 200e comprises two magnet-free circulators 220a, 220b. Each circulator 220a, 220b has a forced time variance.

The circulator device 200a, 200b, 200c, 200d, 200e comprises ports 240a, 240b, 240c, 240d. In this respect the circulator devices 200a, 200b of FIGS. 2a, 2b comprises three ports 240a, 240b, 240c. In the embodiment of FIG. 2c one of the ports of the circulator device 200a, 200b is internally grounded via a short-circuit termination 250, thus resulting in only two ports 240a, 240b. The circulator device 200c of FIG. 2d comprises four ports 240a, 240b, 240c, 240d.

The two circulators 220a, 220b are in the circulator device 200a, 200b, 200c, 200d, 200e arranged to have mutually anti-phase time variance. In other words, both circulators 220a and 220b have periodically forced time variance with the same period but opposite phase. As a convention, a full period of time variance is divided into 360 degrees in phase.

Therefore, if the phases of the two time variance differ by 180 degrees, they are defined as 180 degrees out of phase, anti-phase, or opposite phase. Each of the two circulators 220a, 220b is coupled to all of the ports 240a, 240b, 240c, 240d. That is, as an example, in FIGS. 2a, 2b the circulator 220a is coupled to all three ports 240a, 240b, 240c, and so on.

Embodiments relating to further details of the circulator devices 200a, 200b, 200c, 200d, 200e will now be disclosed.

The herein disclosed circulator devices 200a, 200b, 200c, 200d, 200e can employ two identical magnet-free circulators 220a, 220b operating in balanced mode for all ports 240a, 240b, 240c, 240d. In this respect, two identical circulators 220a, 220b can be defined as the two circulators 220a, 220b being configured such that the same input signal inputted to the two circulators 220a, 220b results in the same output signal being outputted from the two circulators 220a, 220b. In this respect, balanced mode can be defined as the two circulators 220a, 220b being arranged to receive one and the same signal but with mutually opposite phase. Thus, in the illustrative examples of FIGS. 2b, 2c, and 2d, signals S1 and S2 are one and the same signal but with mutually opposite phase. Further, in the illustrative example of FIG. 2a the signals S1 and S2 have the same phase, assuming that the non-desired IM-products on the circulators 200a, 200b outputs are of opposite phase.

Furthermore, the poly-phase local modulations for the two circulators 220a, 220b can have the same angular direction of phase progression but 180 degrees out of phase, so that the circulators 220a and 220b are forced into mutually anti-phase time variance. Hence, according to an embodiment each of the two circulators 220a, 220b is modulated by a poly-phase signal with an angular direction of phase progression, where the two circulators 220a, 220b have same angular direction but 180 degrees out of phase.

There are different examples of poly-phase signals. One example of the poly-phase signal is a poly-phase sinusoidal signal. Further, the poly-phase signal could be a three-phase signal. Hence, the poly-phase signal could be a three-phase sinusoidal signal.

Another example of the poly-phase signal is a four-phase signal. A four-phase signal can be used to control four switches. More specifically, in the first quarter of a period, only the first switch is turned on. Then, in the second quarter of the period, only the second switch is turned on. After that, in the third quarter of the period, only the third switch is turned on. At last, in the fourth quarter of the period, only the fourth switch is turned on, and so on.

For example, as schematically illustrated in FIGS. 2a, 2b, 2c, and 2d each circulator 220a, 220b has three segments which are modulated by three-phase signals 120 degrees apart. At a specific time point, if the segments in one circulator 220a have modulation with progressive phases 0, 120 and −120 degrees, their counterparts in the other circulator 220b have modulation with progressive phases 180, −60 and 60 degrees, respectively. As such, the circulator functionality is preserved, whereas the intermodulation between the signals provided at the ports 240a, 240b, 240c, 240d and local poly-phase signals are cancelled out. As a result, the herein disclosed circulator devices 200a, 200b, 200c, 200d significantly alleviate the intrinsic insertion-loss of previously proposed magnet-free circulators, but still inherits their advantages, such as compactness, low cost and IC compatibility.

Figure 2A:
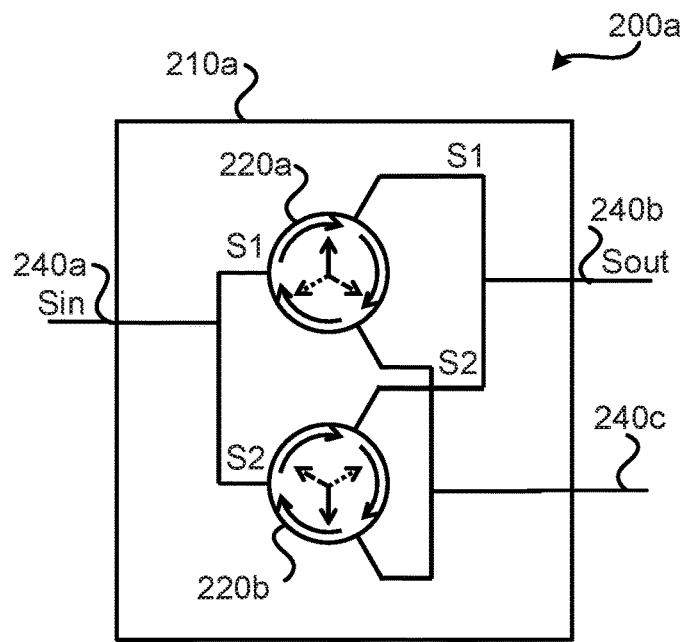
FIGS. 2a, 2b, 2c, 2d, and 2e are schematic diagram of circulator devices according to embodiments.
Figure 2B:
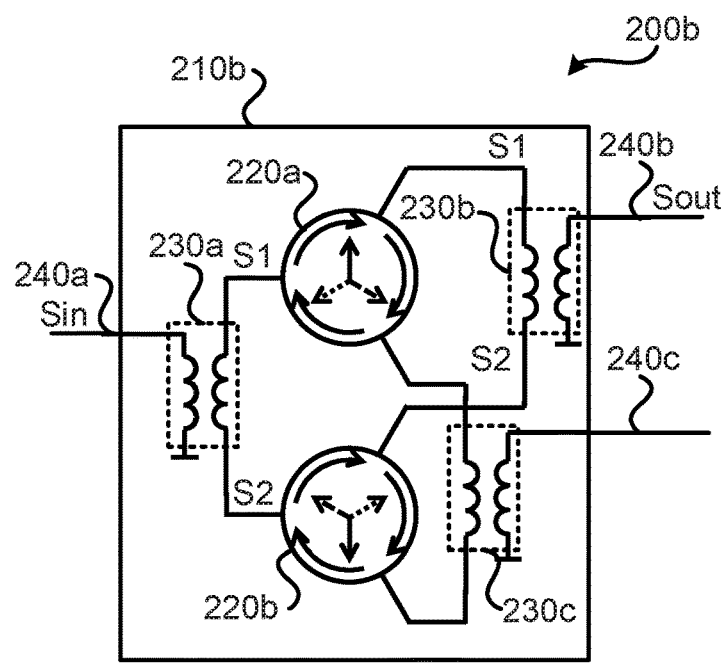
Figure 2C:
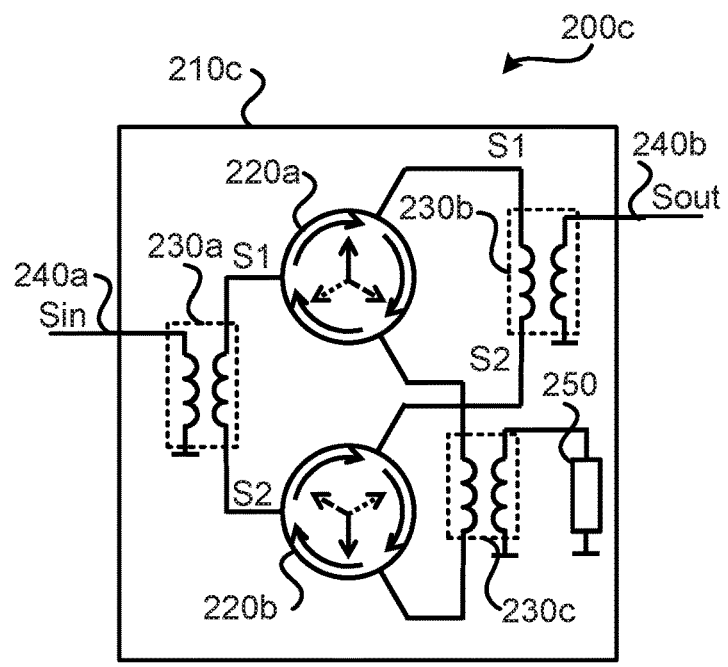
Figure 2D:
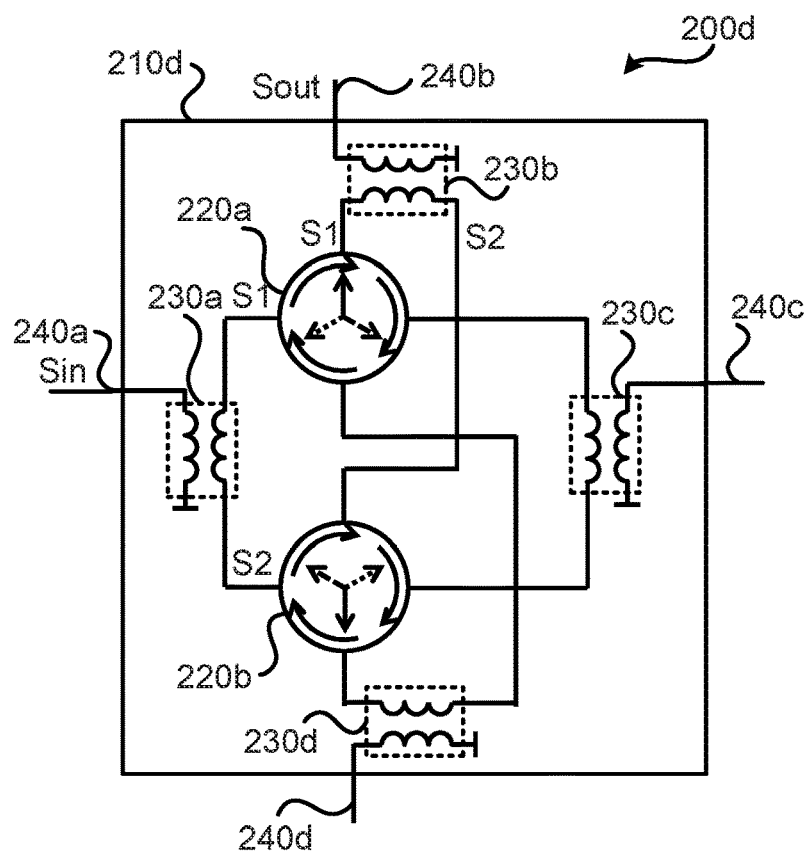

According to some aspects the ports 240a, 240b, 240c, 240d are coupled to both the two circulators 220a, 220b via transformer baluns 230a, 230b, 230c, 230d (as in FIGS. 2b, 2c, and 2d). Hence, according to an embodiment the circulator device 200b, 200c, 200d, 200e further comprises transformer baluns 230a, 230b, 230c, 230d. Each transformer balun 230a, 230b, 230c, 230d can then be arranged to couple one of the ports 240a, 240b, 240c, 240d to both the two circulators 220a, 220b. In this way each of the two circulators 220a, 220b is coupled to all of the ports 240a, 240b, 240c, 240d. For example, if both the signals provided at the ports 240a, 240b, 240c, 240d and the poly-phase local signals (in the circulators 220a, 220b) are anti-phase in the two circulators 220a, 220b, their intermodulation will be in phase. Since the common-mode intermodulation products cannot flow into differential-mode loads via the transformer baluns 230a, 230b, 230c, 230d, power loss at intermodulation frequencies are alleviated. Consequently, the herein disclosed circulator devices 200a, 200b, 200c, 200d, 200e drastically improve the insertion loss of previously proposed magnet-free circulators.

The ports 240a, 240b, 240c, 240d could be coupled by the transformer baluns 230a, 230b, 230c, 230d in the same sequence as the circulation direction. As such, a signal coming from any port 240a, 240b, 240c, 240d is split by the transformer baluns 230a, 230b, 230c, 230d into a balanced pair of signals with the same magnitude but 0 or 180 degrees out of phase. Hence, according to an embodiment one of the transformer baluns 230a, 230b, 230c, 230d is arranged to split a signal received from its port into a first signal and a second signal, where the first signal and the second signal have the same magnitude and are mutually separated in phase by 0 or 180 degrees. For example, in the illustrative examples of FIGS. 2b, 2c, 2d, the transformer balun 230a is arranged to split the signal Sin received from port 240) into a first signal S1 and a second signal S2, where the first signal S1 and the second signal S2 have the same magnitude and are mutually separated in phase by 0 or 180 degrees.

The two signals S1, S2 from the balanced pair could then propagate in their corresponding circulators 220a, 220b in the same circulation direction, so the 0-or-180-degrees phase difference is preserved anywhere in the circulation path. Hence, according to an embodiment one of the two circulators 220a, 220b is arranged to propagate the first signal S1, and the other of the two circulators 220a, 220b is arranged to propagate the second signal S2. For example, in the illustrative examples of FIGS. 2a, 2b, 2c, 2d, circulator 220a is arranged to propagate the first signal S1, and circulator 220b is arranged to propagate the second signal S2. The first signal S1 and the second signal S2 are propagated through the two circulators 220a, 220b in same angular direction to preserve that the first signal S1 and the second signal S2 are mutually separated in phase by 0 or 180 degrees.

When the two signals S1, S2 reach their next ports 240a, 240b, 240c in the circulation direction, they are combined by another transformer balun to form a single-ended output signal Sout. In this way, the circulator functionality is preserved. Hence, according to an embodiment, another of the transformer baluns 230a, 230b, 230c, 230d (in the illustrative examples of FIGS. 2b, 2c, 2d represented by transformer balun 230b) is arranged to combine the first signal S1 received from one of the two circulators 220a, 220b (in the illustrative examples of FIGS. 2b, 2c, 2d represented by circulator 220a) with the second signal S2 received from the other of the two circulators 220a, 220b (in the illustrative examples of FIGS. 2b, 2c, 2d represented by circulator 220b) into a combined signal Sout and to provide the combined signal Sout) to its port (in the illustrative example of FIGS. 2b, 2c, 2d represented by port 240b).

The illustrative examples of FIGS. 2b, 2c, and 2d disclose embodiments in which the signals S1 and S2 on the circulator outputs have opposite phase, while non-desired intermodulation products have the same phase. The herein disclosed embodiments also encompass constructions of circulator devices 200a, 200b, 200c, 200d in which the desired signals S1 and S2 instead are of the same phase and the non-desired intermodulation products on the circulators outputs are of opposite phase. These constructions would require an alternative transformer balun construction that still would produce only the desired signal components at the output port.

Further, transformer baluns 230a, 230b, 230c, 230d are employed in some of the exemplary embodiments (as in FIGS. 2b, 2c, 2d) for the ease of illustration and understanding. In practice, they are not necessary for the functionality and performance of the herein disclosed circulator devices 200a, 200b, 200c, 200d, 200e. Particularly, according to an embodiment (as in FIG. 2a), the ports of the circulators 220a and 220b can be coupled directly to the (external) ports 240a, 240b, 240c, 240d of the circulator devices 200a, 200b, 200c, 200d, 200e. In such embodiments, the circulators 220a and 220b can interact. But their combination still yields the herein disclosed circulator functionality and cancellation of intermodulation power.

Figure 2E:
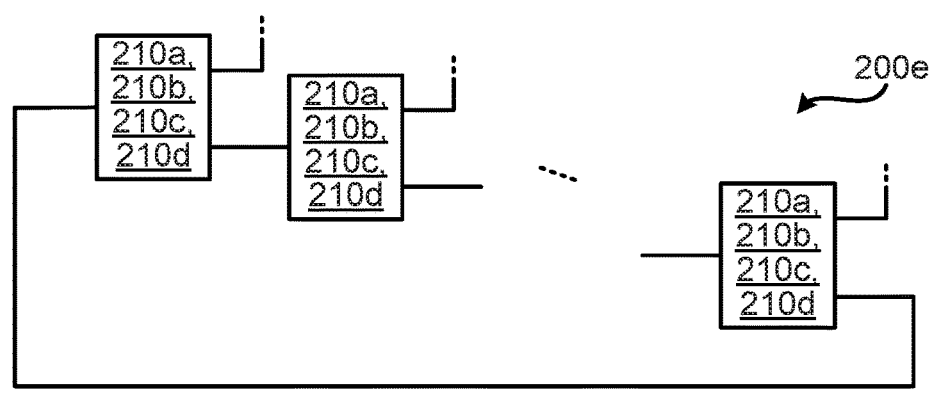

The two circulators 220a, 220b can form a circulator module 210a, 210b, 210c, 210d. Such a circulator module 210a, 210b, 210c, 210d can also comprise transformer baluns 230a, 230b, 230c, 230d. FIG. 2e illustrates an embodiment of a circulator device 200e comprising at least two daisy-chained circulator modules 210a, 210b, 210c, 210d.

Figure 3A:
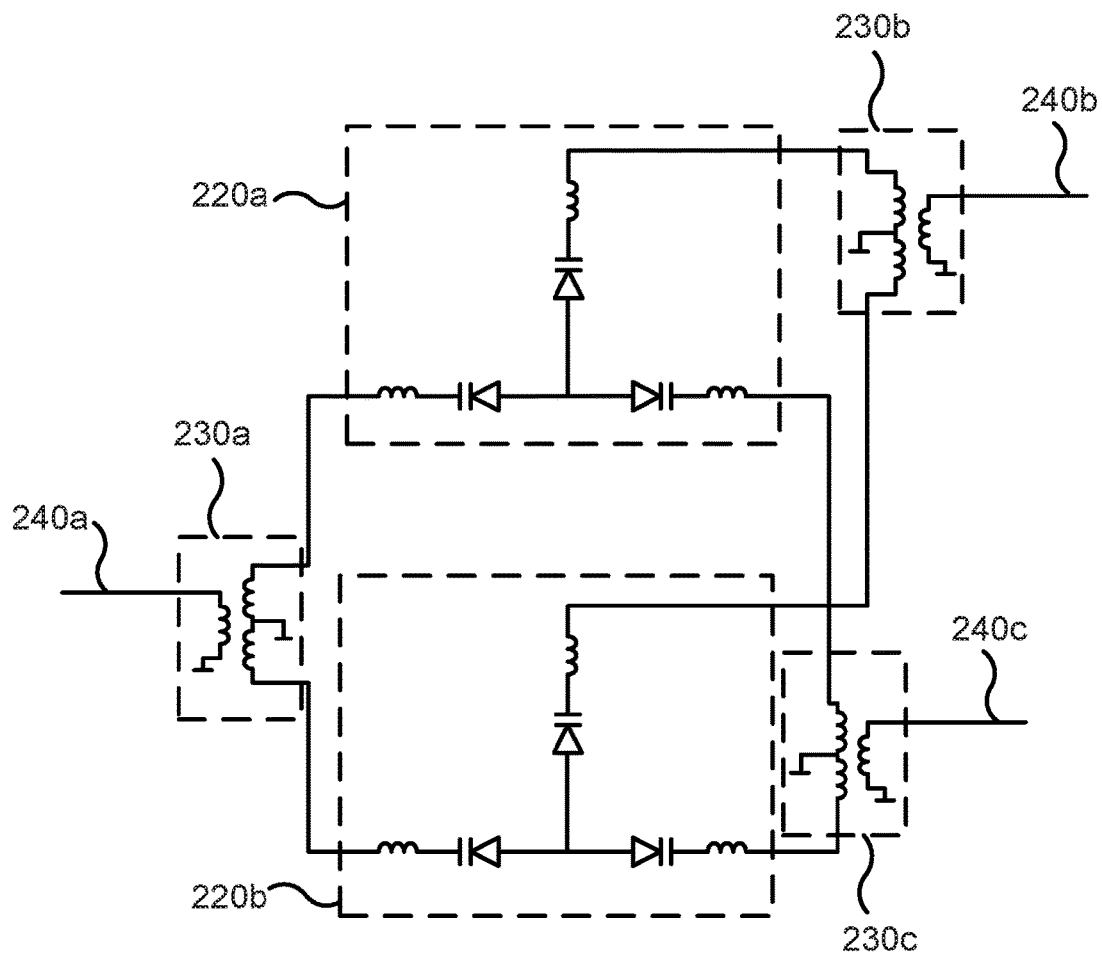
FIGS. 3a, 3b, and 3c are schematic diagram of circuit topologies of circulator devices according to embodiments.
Figure 3B:
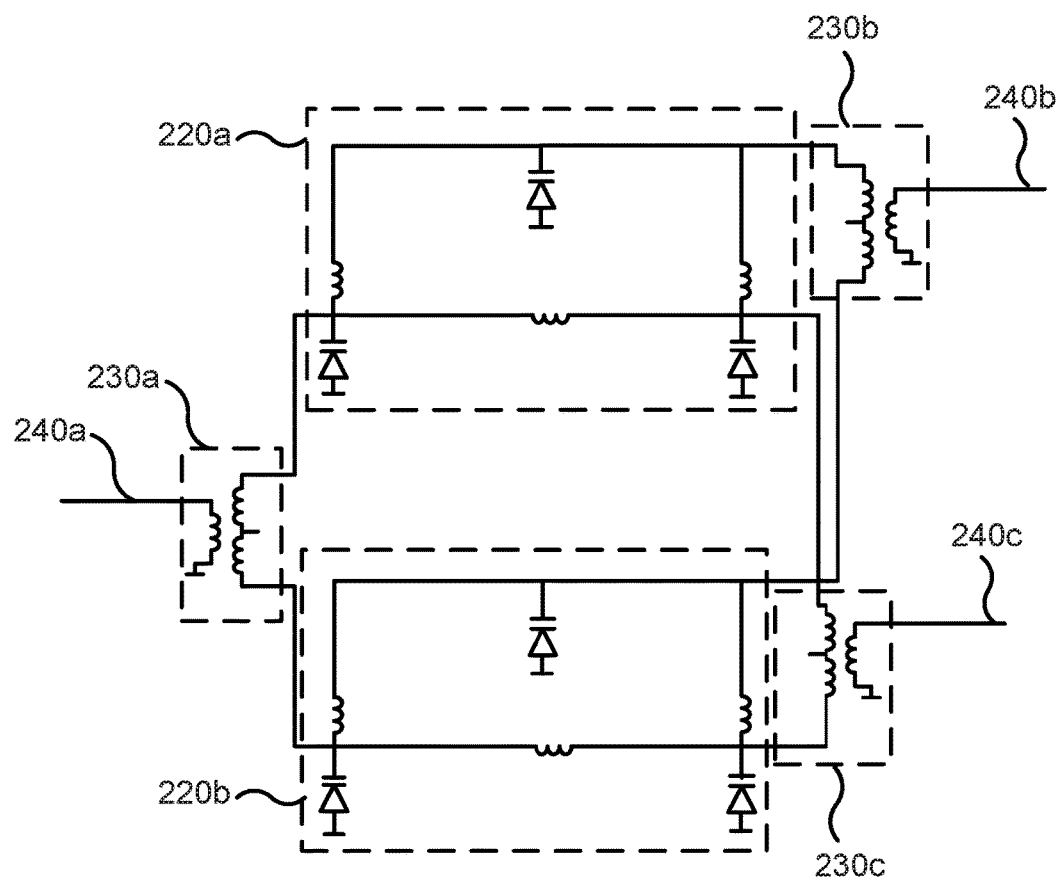
Figure 3C:
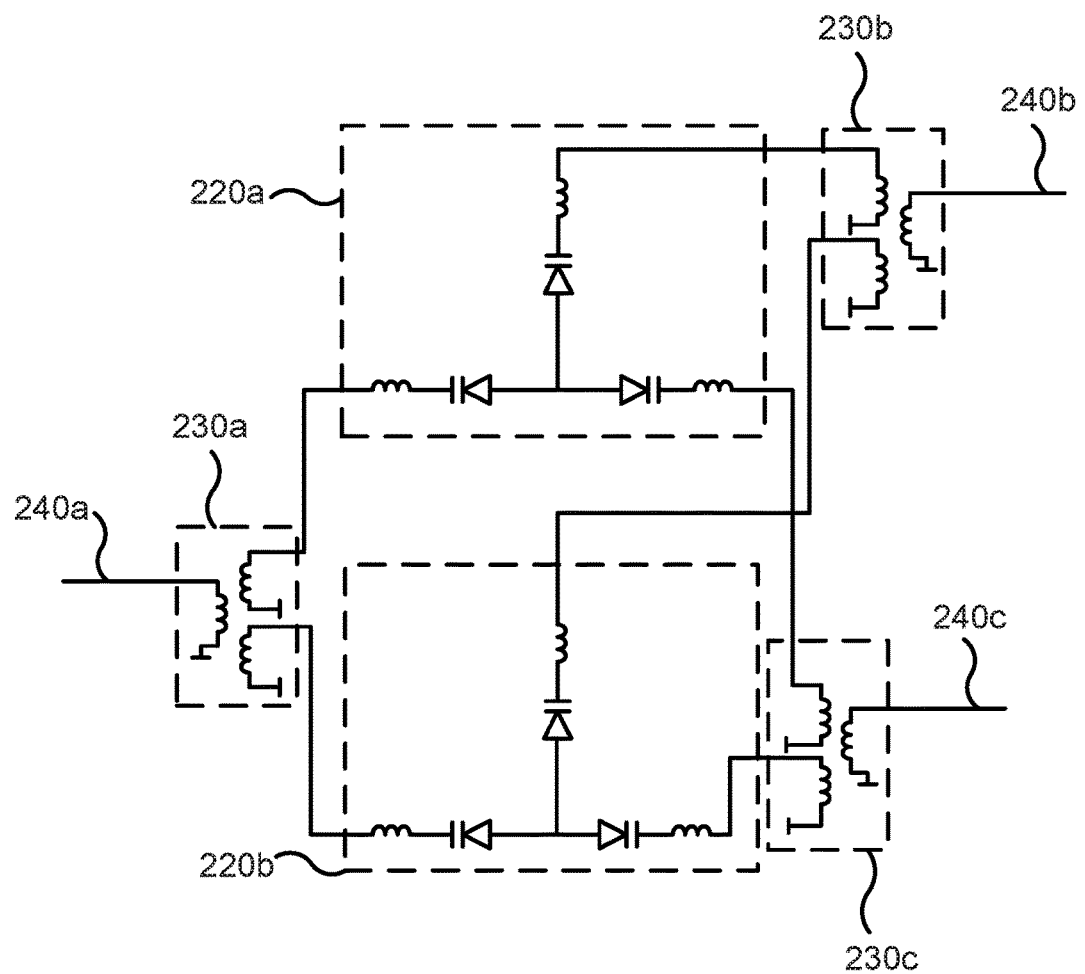

In general terms, the two circulators 220a, 220b comprise electronic components. There can be different ways to arrange the electronic components in the two circulators 220a, 220b. According to a first embodiment the electronic components of at least one of the two circulators 220a, 220b are arranged in a star topology. FIG. 3a schematically illustrates an embodiment of a circulator device where the electronic components of both the two circulators 220a, 220b are arranged in a star topology. The star topology is also known as Y topology. As shown in FIG. 3a, each of the two circulators 220a, 220b is implemented by three series inductor-capacitor (LC) resonators coupled in a star topology. According to a second embodiment the electronic components of at least one of the two circulators 220a, 220b are arranged in a ring topology. The ring topology is also known as Δ topology. FIG. 3b schematically illustrates an embodiment of a circulator device where the electronic components of both the two circulators 220a, 220b are arranged in a ring topology. As shown in FIG. 3b, each of the two circulators 220a, 220b is implemented by three series inductor-capacitor (LC) resonators coupled in a ring topology. Although not illustrated, one of the circulators 220a could have electronic components in a star topology and the other of the two circulators 220b could have electronic components in a ring topology. Further, FIG. 3c schematically illustrates an embodiment of a circulator device where the electronic components of both the two circulators 220a, 220b are arranged in a star topology and with the above mentioned alternative transformer balun construction.

There could be different kinds of electronic components arranged in the two circulators 220a, 220b. The constituting circuit elements (resonators, transformer baluns) can be made from lumped components, transmission lines or cavities. According to an embodiment each of the two circulators 220a, 220b comprise active electronic components. An electronic device is herein defined as active if it is capable of generating output power at any frequency that is larger than the input power at the said frequency. There are different examples of active electronic components. One non-limiting example of active electronic components is variable capacitance diodes.

Hence each of the two circulators 220a, 220b can comprise variable capacitance diodes. Variable capacitors are also known as varactors. Hence, each of the two circulators 220a, 220b can comprise Micro-Electro-Mechanical System (MEMS) varactors. Furthermore, passive capacitors can be connected and disconnected periodically by switches to make the capacitor variable. Thus, according to an embodiment, each of the two circulators 220a, 220b comprises switches. The switches could be made of CMOS transistors.

Figure 4A:
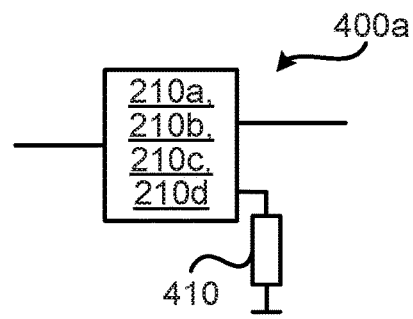
FIGS. 4a and 4b are schematic diagram of isolator devices according to embodiments.
Figure 4B:
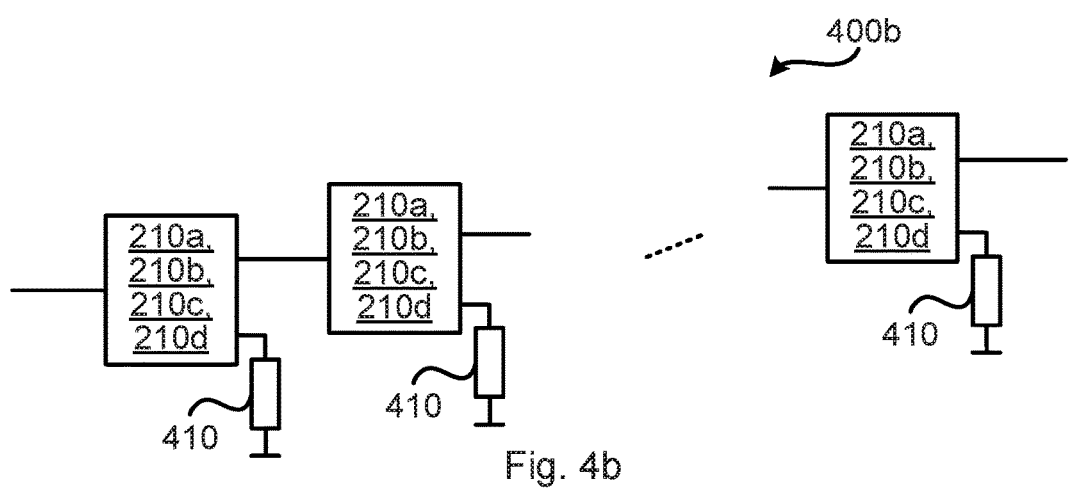

Any of the herein disclosed circulator devices 200a, 200b, 200c, 200d, 200e could be part of an isolator device. FIGS. 4a and 4b are schematic diagram of isolator devices 400a, 400b according to embodiments. The isolator devices 400a, 400b comprises a circulator device 200a, 200b, 200c, 200d, 200e according to any of the embodiments disclosed herein. In the isolator devices 400a, 400b the two circulators 220a, 220b form a circulator module 210a, 210b, 210c, 210d, and one of the ports of the circulator device is terminated via a matched termination impedance 410. FIG. 4a is an example of an isolator device 400a with a single circulator module 210a, 210b, 210c, 210d. FIG. 4b is an example of an isolator device 400b with a plurality of cascaded circulator modules 210a, 210b, 210c, 210d. Hence, according to an embodiment the isolator device 400b comprises at least two cascaded circulator modules 210a, 210b, 210c, 210d.

As disclosed above, the circulator device 200a, 200b, 200c, 200d, 200e or isolator device 400a, 400b could be part of a radio transceiver device 100a, 100b. Hence, the radio transceiver device 100a, 100b can comprise at least one herein disclosed circulator device 200a, 200b, 200c, 200d, 200e or at least one herein disclosed isolator device 400a, 400b.

In order to validate the aforementioned principle of operation, a particular embodiment of FIG. 2b with components of the circulators 220a, 200b in a star topology as in FIG. 3a. Each capacitor is defined by a reversely biased diode, modulated by a local oscillation (240 MHz in this particular embodiment). The three varactors at one circulator 220a are modulated by the local oscillation with phase 0, 120 and −120 degrees, whereas their counterparts at the other circulator 220b are modulated by the same local oscillation with phase 180, −60 and 60 degrees, respectively. At the three ports 240a, 240b, 240c, differential RF signals are coupled to single-ended sources and loads by the transformer baluns 230a, 230b, 230c, whereas the common-mode intermodulation products are terminated by short-circuits at the center-taps of the transformer baluns.

Figure 5A:
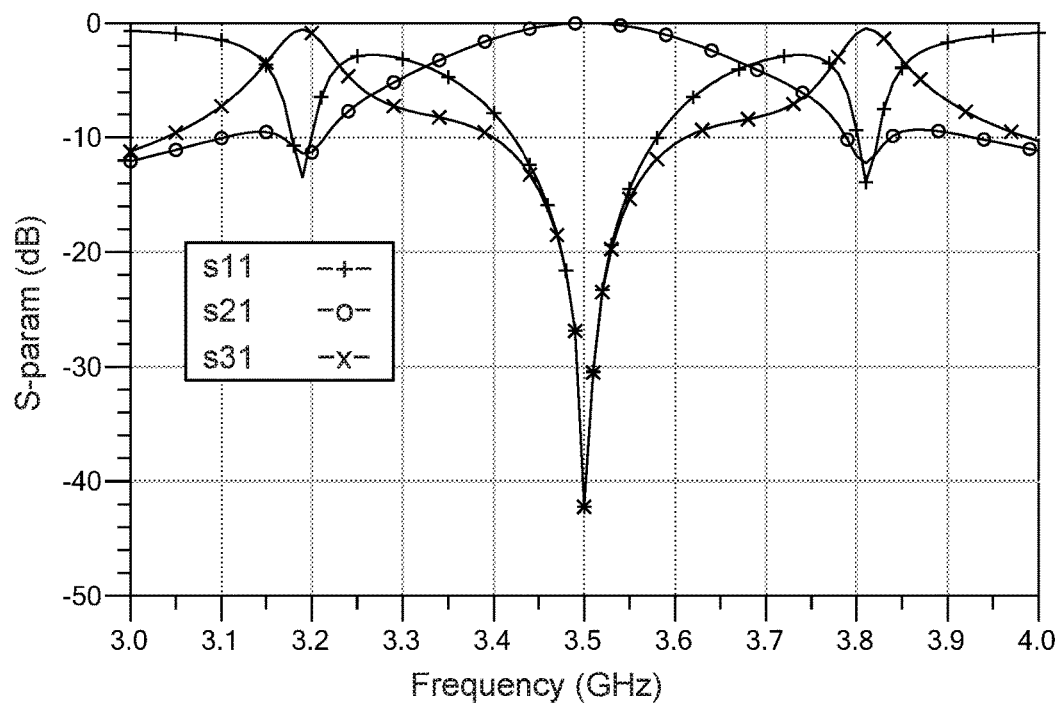
FIGS. 5a, 5b, 5c, 6a, 6b, 6c illustrate simulation results according to embodiments.
Figure 5B:
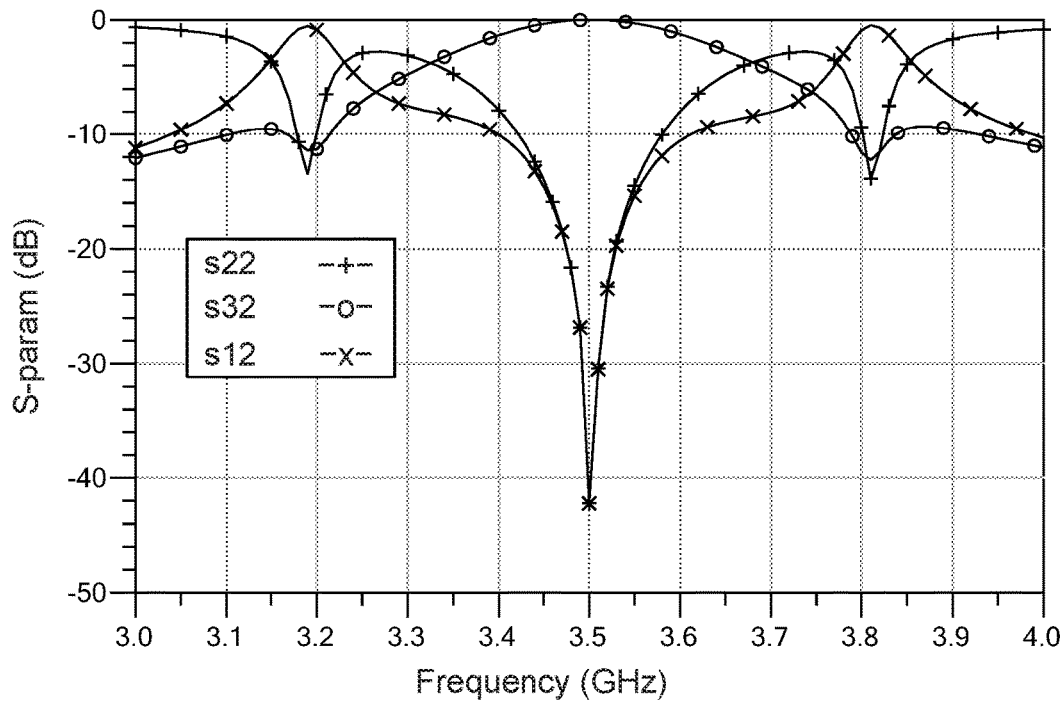
Figure 5C:
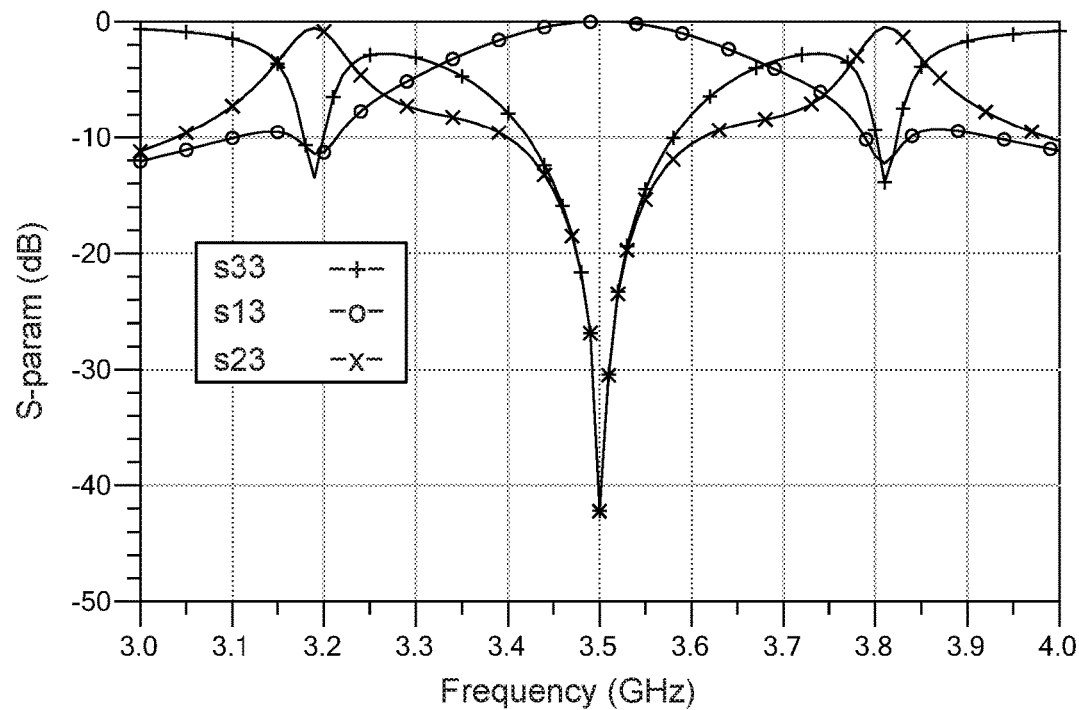
Figure 6A:
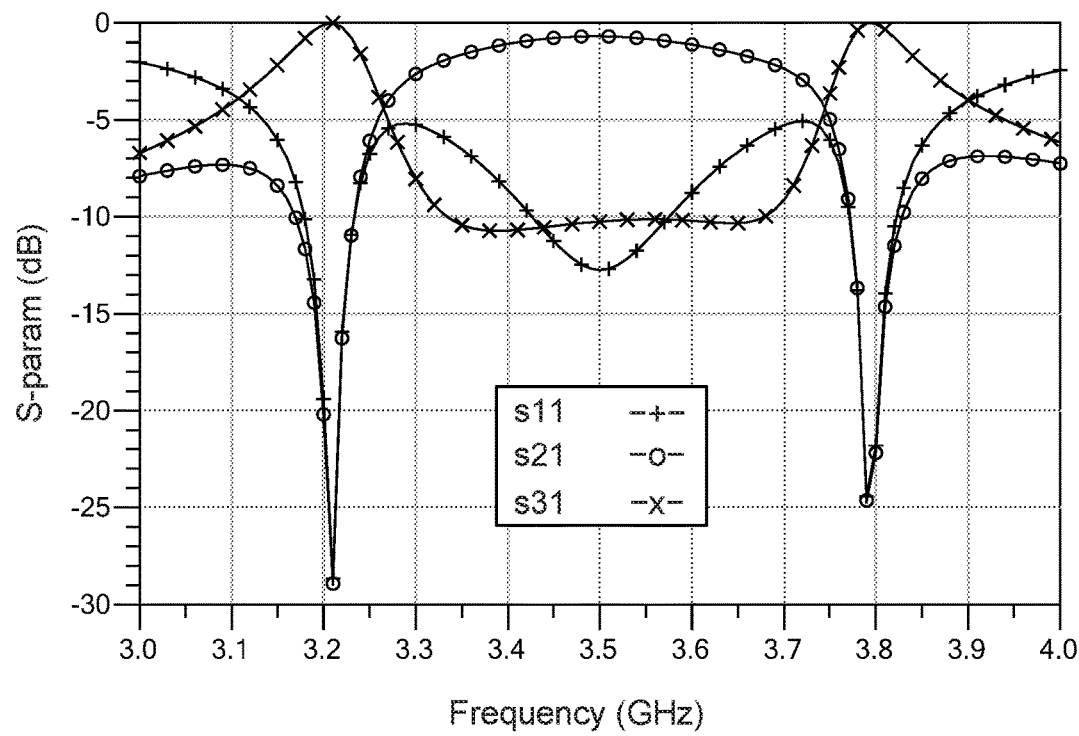
Figure 6B:
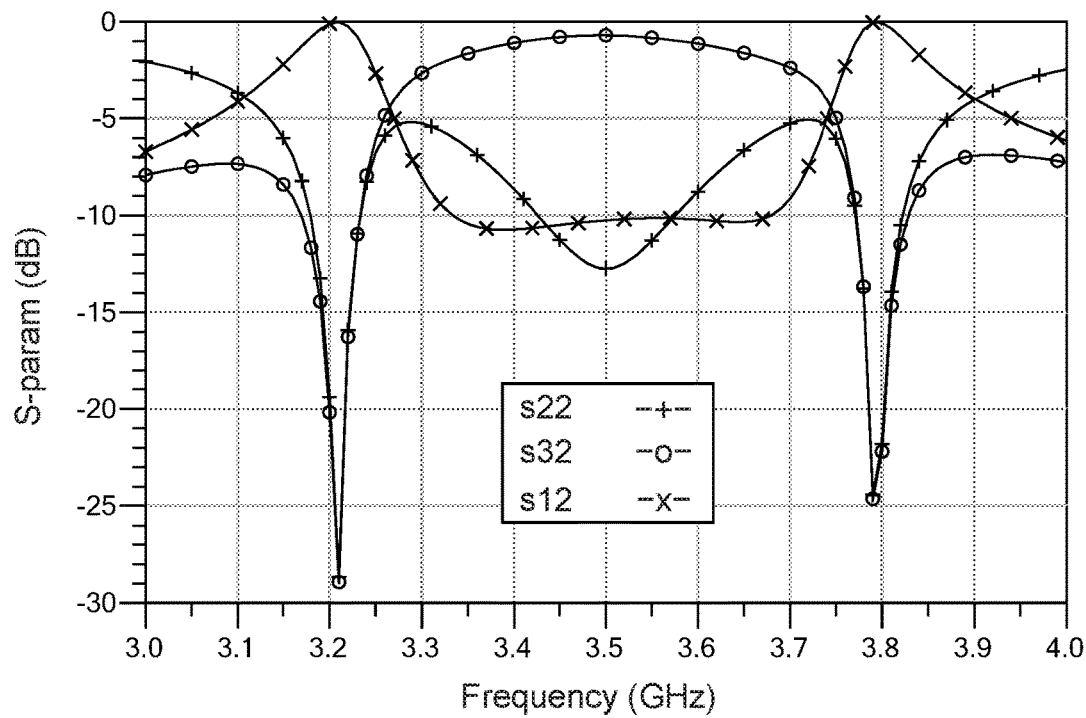
Figure 6C:
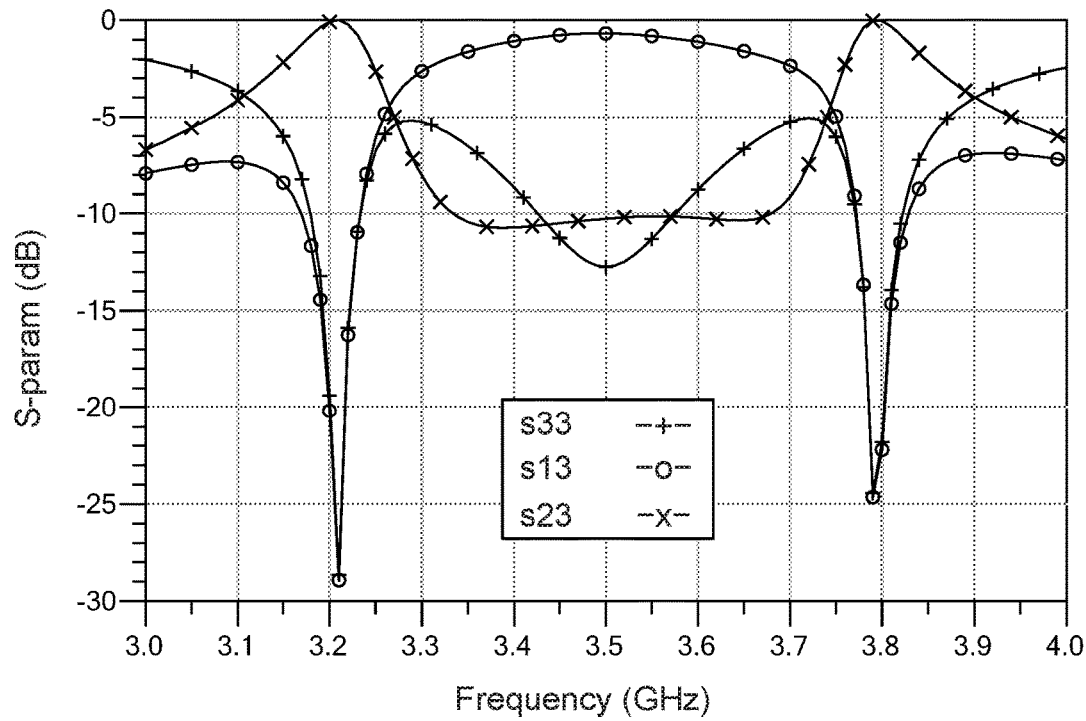

FIGS. 5a, 5b, and 5c illustrate the simulation results according to embodiments. The simulation results in FIGS. 5a, 5b, 5c are provided for a circulator device 200b, 200c, 200d comprising transformer baluns 230a, 230b, 230c (as for the circulator device 200b), and the simulation results in FIGS. 6a, 6b, 6c are provided for a circulator device not comprising any transformer baluns (as for the circulator device 200a).

The RF sources at the three ports 240a, 240b, 240c were activated sequentially, and the harmonic balance simulation results are plotted in FIGS. 5a, 5b, and 5c, respectively. In FIGS. 5a, 5b, and 5c the notation "Sxy" where x, y=1, 2, or 3 indicates the transfer from port y to port x. As can be observed from these figures, the clockwise transfers S21, S32, S13, i.e. from port 240a to port 240b, from port 240b to port 240c, and from port 240c to port 240a, have almost 0 dB magnitude, indicating very low insertion loss. Furthermore, the counter-clockwise transfers S23, S12, S31, i.e., from port 240c to port 240b, from port 240b to port 240a, and from port 240a to port 240c, are below −40 dB at the center frequency of 3.5 GHz, indicating decent isolation. The reflection terms S11, S22, S33, i.e. from port 240a to port 240a, from port 240b to port 240b, and from port 240c to port 240c, are also below −40 dB, indicating good port match. As can be observed from these simulation results, the proposed technique has the theoretical performance of an ideal circulator at the operating frequency.

To summarize, the intrinsic insertion-loss due to time variance of the previously proposed magnet-free circulators in the afore referenced papers entitled "Magnetless Microwave Circulators Based on Spatiotemporally Modulated Rings of Coupled Resonators" and "Magnetic-free non-reciprocity based on staggered commutation" is eliminated almost completely by the herein disclosed circulator devices 200a, 200b, 200c, 200d, 200e.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A circulator device, comprising:
two magnet-free circulators, each of which having a forced time variance;
a plurality of ports;
wherein the two circulators are configured to have mutually anti-phase time variance;
wherein each of the two circulators is coupled to all of the ports;
wherein each of the two circulators is modulated by a poly-phase signal with an angular direction of phase progression; and
wherein the two circulators have same angular direction but 180 degrees out of phase.

2. The circulator device of claim 1, wherein the poly-phase signal is a poly-phase sinusoidal signal.

3. The circulator device of claim 1, wherein the poly-phase signal is a three-phase signal.

4. The circulator device of claim 1, wherein the two circulators are configured to receive one and the same signal but with mutually opposite phase.

5. The circulator device of claim 1, wherein the two circulators are configured to receive one and the same signal and with same phase.

6. The circulator device of claim 1, wherein the two circulators are configured such that the same input signal inputted to the two circulators results in the same output signal being outputted from the two circulators.

7. The circulator device of claim 1, wherein electronic components of at least one of the two circulators are arranged in a star topology.

8. The circulator device of claim 1, wherein electronic components of at least one of the two circulators are arranged in a ring topology.

9. The circulator device of claim 1, wherein each of the two circulators comprise active electronic components.

10. The circulator device of claim 1, wherein each of the two circulators comprises variable capacitance diodes.

11. The circulator device of claim 1, wherein each of the two circulators comprises Micro-Electro-Mechanical System (MEMS) varactors.

12. The circulator device of claim 1, wherein each of the two circulators comprises switches.

13. The circulator device of claim 12, wherein the switches are made of complementary-metal-oxide-semiconductor (CMOS) transistors.

14. The circulator device of claim 1:
wherein the two circulators form a circulator module; and
wherein the circulator device comprises at least two daisy-chained circulator modules.

15. A circulator device, comprising:
two magnet-free circulators, each of which having a forced time variance;
a plurality of ports;
wherein the two circulators are configured to have mutually anti-phase time variance;
wherein each of the two circulators is coupled to all of the ports;
further comprising a plurality of transformer baluns;
wherein each transformer balun is configured to couple one of the ports to both the two circulators;
wherein one of the transformer baluns is configured to split a signal (Sin) received from its port into a first signal and a second signal; and
wherein the first signal and the second signal have same magnitude and mutually separated in phase by 0 or 180 degrees.

16. The circulator device of claim 15:
wherein each of the two circulators is modulated by a poly-phase signal with an angular direction of phase progression; and
wherein the two circulators have same angular direction but 180 degrees out of phase.

17. The circulator device of claim 15:
wherein one of the two circulators is configured to propagate the first signal;
wherein the other of the two circulators is configured to propagate the second signal; and
wherein the first signal and the second signal are propagated through the two circulators in same angular direction to preserve that the first signal and the second signal are mutually separated in phase by 0 or 180 degrees.

18. The circulator device of claim 17, wherein another of the transformer baluns is configured to combine the first signal received from the one of the two circulators with the second signal received from the other of the two circulators into a combined signal and to provide the combined signal to its port.

19. The circulator device of claim 15, wherein the poly-phase signal is a poly-phase sinusoidal signal.

20. The circulator device of claim 15, wherein the poly-phase signal is a three-phase signal.

21. The circulator device of claim 15, wherein the two circulators are configured to receive one and the same signal but with mutually opposite phase.

22. An isolator device, comprising:
a circulator device, the circulator device comprising:
two magnet-free circulators, each of which having a forced time variance;
a plurality of ports;
wherein the two circulators are configured to have mutually anti-phase time variance;
wherein each of the two circulators is coupled to all of the ports;

wherein each of the two circulators is modulated by a poly-phase signal with an angular direction of phase progression;

wherein the two circulators have same angular direction but 180 degrees out of phase wherein the two circulators form a circulator module; and wherein one of the ports of the circulator device is grounded via a matched termination impedance.

23. The isolator device of claim 22, further comprising at least two cascaded circulator modules.

24. A radio transceiver device, comprising:

at least one circulator device, the at least one circulator device comprising:

two magnet-free circulators, each of which having a forced time variance;

a plurality of ports;

wherein the two circulators are configured to have mutually anti-phase time variance;

wherein each of the two circulators is coupled to all of the ports;

wherein each of the two circulators is modulated by a poly-phase signal with an angular direction of phase progression; and wherein the two circulators have same angular direction but 180 degrees out of phase.

* * * * *